(12) United States Patent
Mak et al.

(10) Patent No.: US 6,975,954 B2
(45) Date of Patent: Dec. 13, 2005

(54) FUNCTIONAL TESTING OF LOGIC CIRCUITS THAT USE HIGH-SPEED LINKS

(75) Inventors: Tak M. Mak, Union City, CA (US); Victor W. Lee, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 65 days.

(21) Appl. No.: 10/603,292

(22) Filed: Jun. 24, 2003

(65) Prior Publication Data

US 2004/0267484 A1 Dec. 30, 2004

(51) Int. Cl.$^7$ ................................................. G06F 11/26
(52) U.S. Cl. ........................ 702/118; 702/117; 702/119; 702/123; 714/718; 714/724
(58) Field of Search .................. 702/117–119, 122–124, 702/186, 189, 80; 714/4, 47, 48, 25, 30–32, 42, 45, 37–39, 27–29, 36, 10, 718, 724, 738, 741, 742; 711/147–149, 118, 122, 117, 130, 141; 712/43, 201; 709/213, 214; 710/317, 316, 243, 244; 365/201; 713/2; 707/4

(56) References Cited

U.S. PATENT DOCUMENTS

| | | | | |
|---|---|---|---|---|
| 6,026,461 A | * | 2/2000 | Baxter et al. ............... | 710/244 |
| 6,195,731 B1 | * | 2/2001 | Bordaz et al. .............. | 711/147 |
| 6,249,893 B1 | * | 6/2001 | Rajsuman et al. .......... | 714/741 |
| 6,499,028 B1 | * | 12/2002 | Brock et al. ................ | 707/4 |
| 6,601,183 B1 | * | 7/2003 | Larson et al. .............. | 714/4 |
| 6,668,308 B2 | * | 12/2003 | Barroso et al. ............ | 711/141 |
| 6,681,351 B1 | * | 1/2004 | Kittross et al. ............ | 714/724 |
| 6,842,857 B2 | * | 1/2005 | Lee et al. .................... | 713/2 |

* cited by examiner

Primary Examiner—Hal Wachsman
(74) Attorney, Agent, or Firm—Blakely, Sokoloff, Taylor & Zafman LLP (57) ABSTRACT

A method of testing a DUT is provided. The method comprises loading a memory within a link-based system with a functional test program, executing the functional test program in a processor core of the link-based system, and routing test signals generated during execution of the functional test program to a response agent embedded in the link-based system via an external path.

7 Claims, 7 Drawing Sheets

FUNCTIONAL TESTING OF LOGIC CIRCUITS THAT USE HIGH-SPEED LINKS

FIELD OF THE INVENTION

This invention relates to functional testing of logic circuits. In particular, the invention relates to the functional testing of a microprocessor circuit that uses a high-speed link to send and receive data.

BACKGROUND

A high-speed link is a point-to-point interconnect that transfers data between two components using a link transfer protocol. Using high-speed differential signaling and sophisticated clocking, links are replacing buses as the main interconnect between different components (such as, a processor, a chipset, an input/output bridge, etc.) within a computer system. Links make use of a link transfer protocol that is different from a bus transfer protocol. For example, in the case of the link transfer protocol, transactions in links are broken up into requests and replies to increase scalability and to hide transfer latency.

Component functional tests have proven to be valuable in detecting fault types that are not easily modeled or excited with structural tests. One requirement to enable component functioning tests is the availability of cycle-accurate boundary (interface) traces for a device under test (DUT). According to existing techniques for performing component functional tests, simulation traces (boundary/interface behavior) for a (DUT) are captured during simulation. These simulation traces are then stored in a memory of an automatic test equipment (ATE), and later injected into the (DUT). The (DUT's) responses to the simulation traces can then be compared to an expected response. A prerequisite to this manner of functional testing is the existence of full count, high performance ATE's that match the behavior of the DUT's buses.

Recent advances in semiconductor technology has led to the development of devices and interfaces that operate at frequencies ranging up to several Gigahertz. These high-speed/frequency devices are also paired with high bandwidth data transfer input/output (IO) channels to provide a higher level of system level performance. To support these high bandwidth IO, link based architectures replace traditional bus structures. Link based architectures feature low voltage differential, clock embedded signaling technologies and require very unique complementary circuits to read/write the data sent off the IO channels. These developments in processors, IO speeds, and signaling technologies are placing unique challenges on ATE's. For example, existing ATE's do not have the speed or the number of IO channels or the signaling technologies to perform functional testing of components, as described.

One solution to this problem is to perform a true-system test, i.e., where the component, its operating system and any loaded applications are tested. However, a system test is usually done for a single system/design, selected operating systems and selected applications. Further, only a few selected functions/aspects of the selected operating systems and applications are tested. Thus, the number of faults that can be excited is limited.

Structure based functional tests (SBFT) and functional random instruction tests for speed (FRITS) are execution-based test methodologies designed to address the ATE's speed and input/output bandwidth issues. Under SBFT's and FRITS' methodologies, a test code is first loaded into a DUT's internal storage, for example, the caches in a processor. Thereafter, the test code is executed and is used to test different parts of the DUT. Because all testing is done internally, the ATE is effectively decoupled from component testing, thus solving the ATE's speed and I/O bandwidth and signaling problems. One drawback with this type of testing is that it does not cover the DUT's input/output channels as well as the associated protocol, crossbar and link control layers. In order to extend SBFT and FRITS's type tests to cover a DUT's input/output channel and all these other associated logic, ATE's will be required to provide the proper IO responses at the right time. However, this approach would be limited by the ATE's speed, IO bandwidth and signaling complexity problems.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
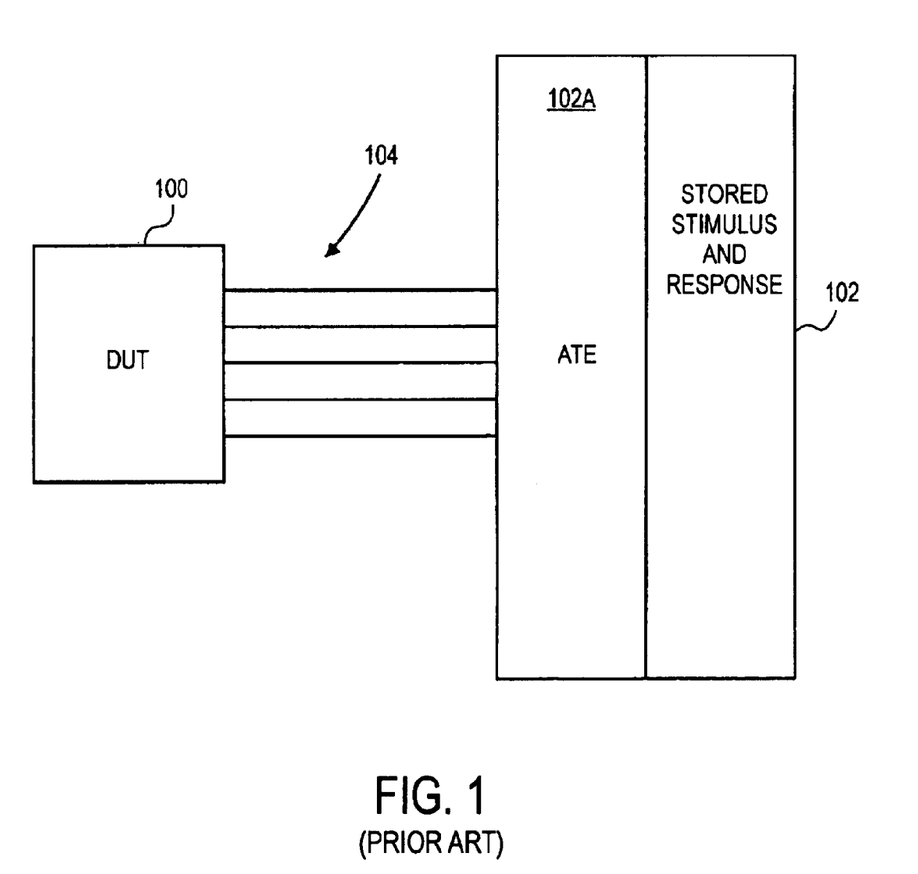
FIGS. 1 and 2 illustrate prior art techniques for the functional testing of logic components.
Figure 2:
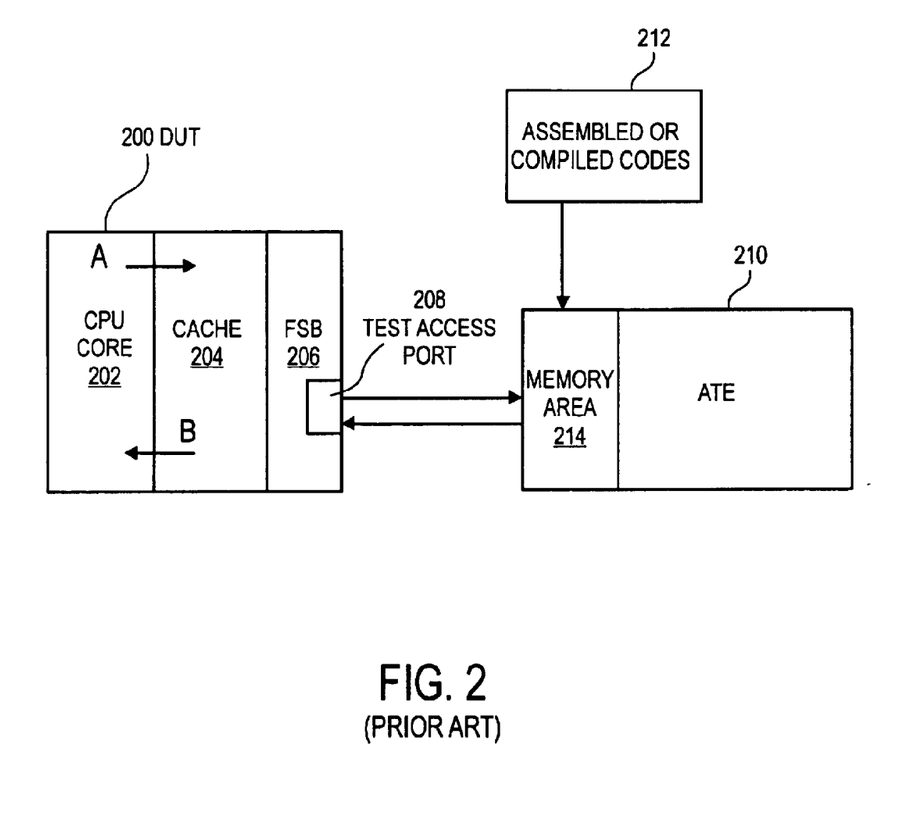

FIGS. 1 and 2 of the drawings illustrate functional testing techniques of the prior art. Referring to FIG. 1, a DUT 100 is connected to an ATE 102 via a bus 104 that provides control signals, data signals, clock signals and power signals to the DUT 100. The bus 104 connects to all pins (not shown) of the DUT 100. The ATE 102 includes an area 102A within which simulation traces to be used to excite faults within the DUT 100 are stored. Further, the storage area 102A also includes expected responses to the simulation traces. In use, the bus 104 is used to send the simulation traces to the DUT 100 and to receive responses thereto. Faults are detected when the responses to the simulation traces deviate from the expected responses.

Referring now to FIG. 2 of the drawings, a DUT 100 is shown to include a central processing unit (CPU) core 202, a cache memory 204, and a front side bus 206. The DUT 200 also includes a test access port 208 which in one embodiment may be a Joint Test Action Group (JTAG) port as defined in the Institute of Electrical and Electronic Engineers (IEEE) 1149.1 specification. Also shown in FIG. 2 is an ATE 210 which includes assembled or compiled test codes 212 stored in a memory area 214. In use, the assembled/compiled test codes 212 are input into the DUT 200 via the test access port 208 and stored in the cache memory 204. The CPU core 202 accesses the assembled/compiled codes stored in the cache memory 204 and executes the code. As can be seen, execution of the compiled codes 212 results in an interaction between the CPU core 202 and the cache memory 204 as depicted by arrows A and B in FIG. 2. This interaction does not involve any of the input/output (IO) mechanisms of the DUT 200, which are consequently not tested. Thus, the speed at which the ATE 210 can send responses to the CPU core 202 is not an issue. This is one advantage of the testing methodology illustrated in FIG. 2 over the testing methodology illustrated in FIG. 1. However, the methodology illustrated with respect to FIG. 2 suffers from a disadvantage in that the IO mechanisms are not tested.

Figure 3:
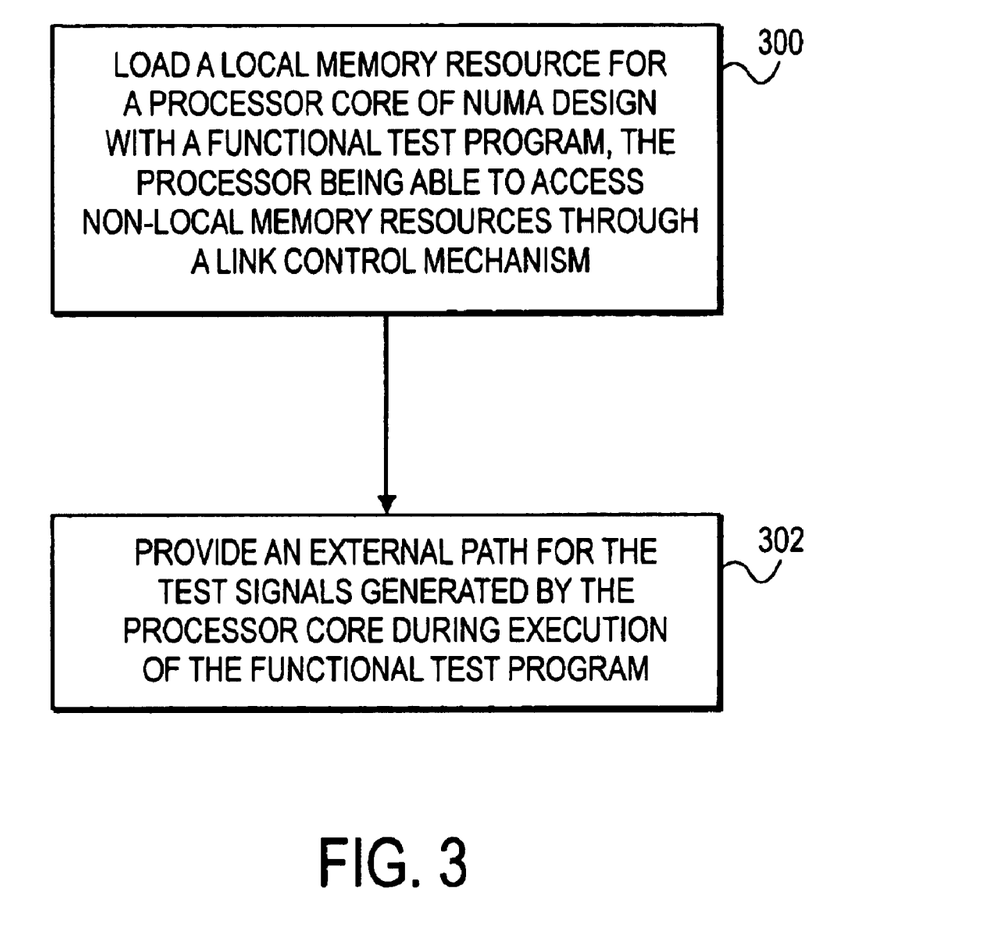
FIGS. 3 and 4 are flowcharts of operations performed in accordance with embodiments of the present invention.

FIG. 3 shows a flowchart of the testing methodology of the present invention, in accordance with one embodiment. Referring to FIG. 3, at block 300, a local processor core within a link based system is loaded with a functional test program of non-uniform memory access (NUMA) design. NUMA design refers to an architecture in which a number of nodes are linked together via a fast interconnect. Each node may include a number of processors, connected to a local memory via a local bus. Further, each processor may include its own local cache memory. NUMA design nomenclature includes the concept of "local memory" (which is memory that physically resides within a node) and "remote memory" (which is memory that physical resides on other nodes). However, the concept of local/remote memory only exists at hardware level. From a programmer's perspective, all memory is treated as "local memory."

Referring again to FIG. 3 of the drawings, at block 302, an external path test signal in the form of link packets generated by the processor core to the execution of the functional test program is provided.

Figure 5:
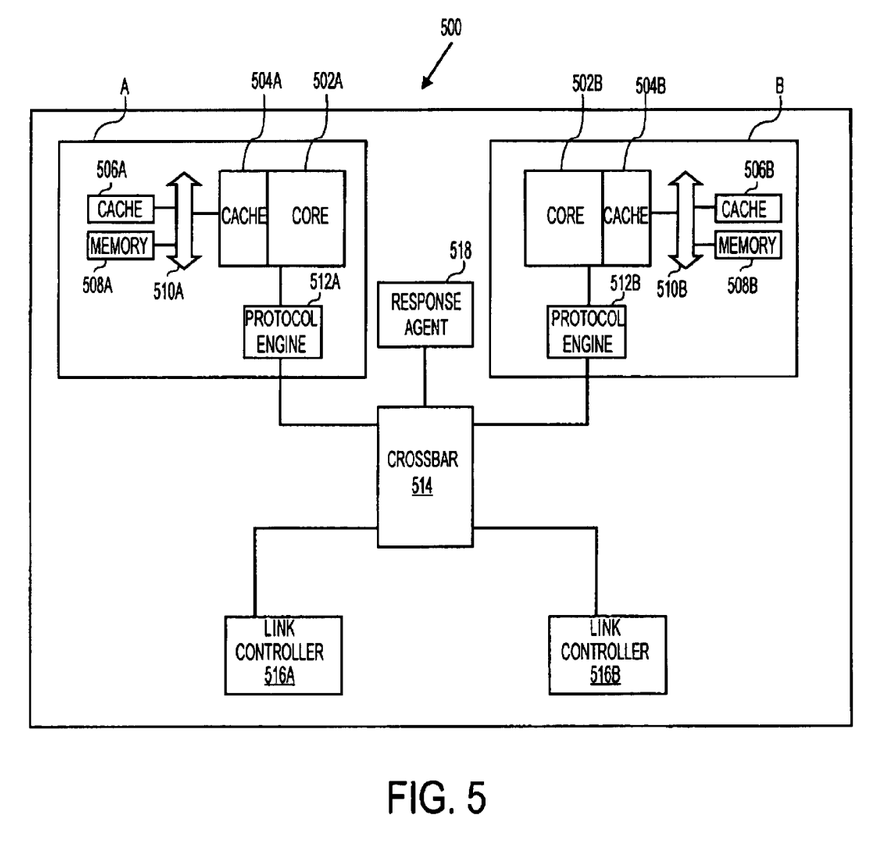
FIG. 5 shows a system in accordance with one embodiment of the invention.

The steps outlined in the flowchart of FIG. 3 are best understood with reference to FIG. 5.

FIG. 5 shows a system 500 of NUMA design. The system 500 is integrated into a single semiconductor die. The system 500 includes two processing nodes, namely node A and node B. However, it is to be appreciated that, in other embodiments, more processing nodes may be included.

The processing nodes A and B have identical components. The components of node A are referenced with a reference numeral and a suffix "A." A component of the node B that is equivalent to a component of the node A will share the same reference numeral as the component of the node A, but will have a "B" suffix. The processing node A includes a processor core 502A which has a cache memory area 504A. A separate cache memory device 506A and a memory device 508A are coupled to the processor core via a bus 510A. The node A also includes a protocol engine 512A and a link controller 516A. The function of both these components will be described below. A crossbar switch 514 provides multiple exclusive lines between the processor cores 502A and 502B and the memory devices 508A and 508B. If memory is partitioned into N blocks, then N concurrent memory accesses can be accommodated using the crossbar switch 514.

In one embodiment, the loading operation performed at block 300 in FIG. 3 of the drawings is achieved by using a test access port, such as a JTAG port to load the functional test program into the cache 506A. For example, an ATE may be connected directly to the JTAG port in order to load the cache 504A with the functional test program. Obviously, there are many other access methods that are not to be detailed here.

In one embodiment, the operations performed under block 300 include connecting an ATE directly to the link controllers 516A, and 516B. The ATE thus defines an external path for test link packets generated by the processor core 502A during execution of the functional test program loaded into the cache 506A. It is important to note that the ATE does not provide a response to the test link packets. In another embodiment, a test interface board may be used to define the external path. In one embodiment, the methodology of the present invention also includes providing a response agent that is capable of responding to the test link packets. The response agent is indicated by reference numeral 518 in FIG. 5 of the drawings. The crossbar switch 514 maintains the address of the response agent 518 within its address space which contains the addresses of all components addressable by the processor cores 502A and 502B. When operating in test mode, the processor core 502A is configured to boot off its internal cache 504A. This ensures that the functional test program loaded in the internal cache 504A gets executed. As a result of the execution of the functional test program, the processor core 502A generates test link packets which leaves the system 500/semiconductor die via the link controller 516 and travels via an intermediate external path provided by the ATE or a test interface board to the response agent 518. The purpose of the response agent 518 is to provide an appropriate response to the test link packets which is routed by the crossbar switch 518 via the external path provided by the ATE back to the processor core 502A. The test link packets may embody a data request or an instruction request. The actual path traveled by the test link packets is shown by the arrows in FIG. 6 of the drawings, whereas the actual path traveled by the response from the response agent 518 is shown by the arrows in FIG. 7.

Figure 4:
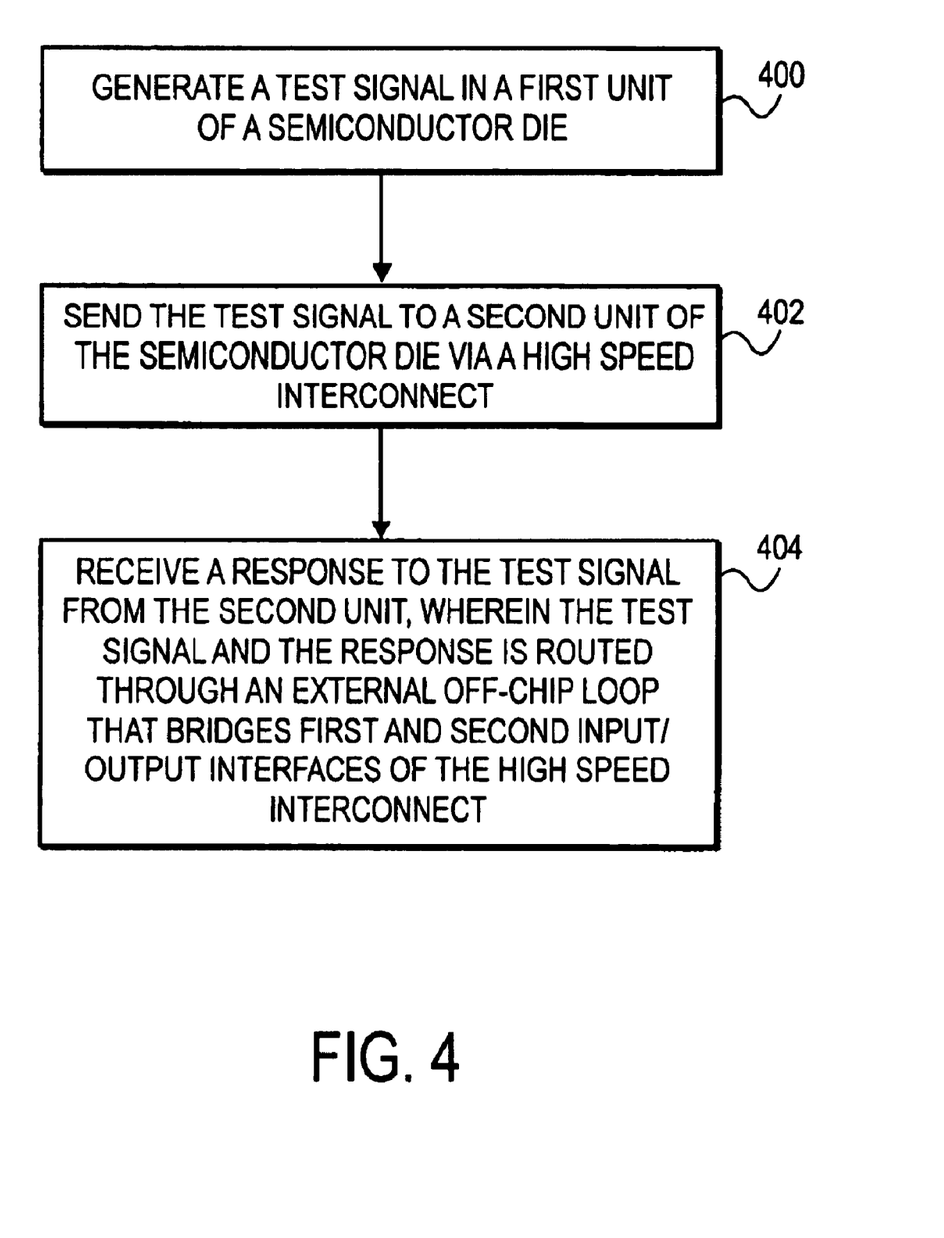
Figure 6:
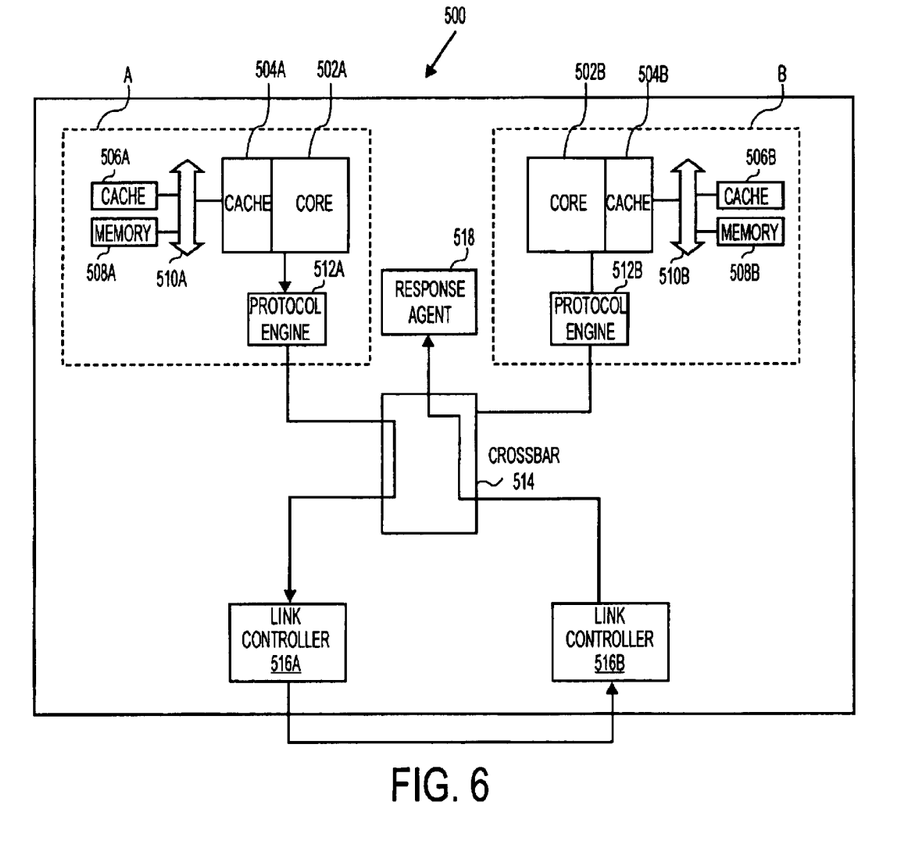
FIGS. 6–7 show the path of test signals/responses generated using the system of FIG. 5.

FIG. 4 illustrates a flowchart of operations performed in accordance with another embodiment of the invention. Referring to FIG. 4, at block 400, a test link packet is generated in a first unit of a semiconductor die. In one embodiment, the first unit may comprise a processor core, e.g., the core 504A. At block 402, the test link packets is sent to a second unit of the semiconductor die via a high-speed interconnect. In one embodiment, the second unit of the semiconductor die may include the processor core 502B, and the high-speed interconnect node may be defined by link controllers 516A and 516B as shown in FIG. 5 of the drawings. Thereafter, at block 406, a response to the test link packet is received from the second unit, the test link packet and the response having been routed through an external off-chip loop that bridges first and second input/output interfaces (link controllers 516A, 516B) of the high-speed interconnect. The paths traveled by the test link packet and its associated response are shown in FIGS. 6 and 7 of the drawings, respectively.

Referring to FIG. 5 of the drawings, the function of the protocol engine 512A is to compose a test link packets generated by the processor core 502A into a link request. The link requests are then passed to the crossbar switch 514 to the link controller 516A. At the link controller 516A, the request is translated into physical layer units. These physical layer units are then transferred to the link controller 516B on the same die via the external loop-back path provided by the ATE or the test interface board. The link controller 516B forwards the request to the response agent 518 via the crossbar switch 514.

When the request is received at the response agent 518, the response agent decodes the request and generates an appropriate response based on the link protocol used by the protocol and link controllers 516A, 516B. The requests may be divided into instruction requests or data requests. For instruction requests, the response agent 518 includes a small section of code (preferably occupying a minimal amount of cache lines) that holds a small program that can be executed by the processor core 502A upon receipt. This small program computes a signature and passes program control back to the main program, i.e., the functional test program loaded into the cache 506A. The computed signature can be used to verify that the instruction request logic (due to branches, jumps, etc.) functions properly. For data requests, the response agent 518 returns predefined data or pseudo-random data. The main program will then check the data and verify that the data request logic functioned properly.

Figure 7:
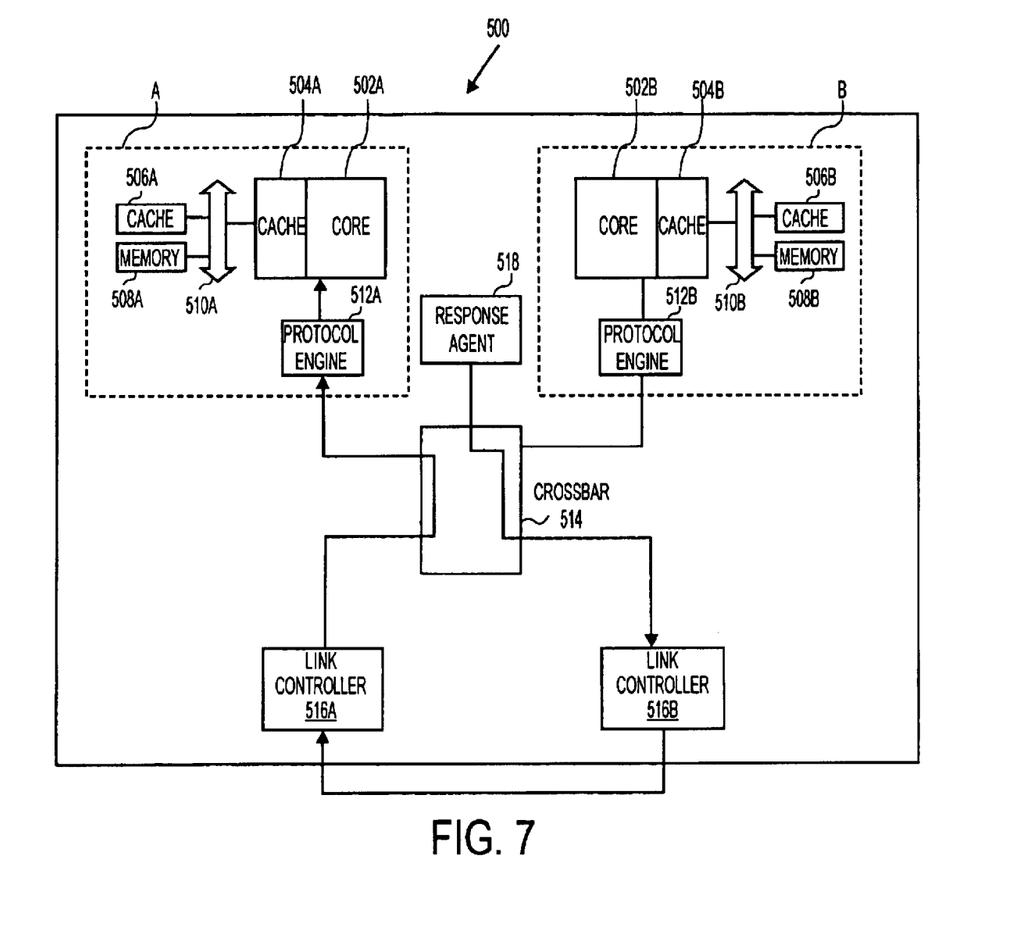

As noted above, the response is sent back to the requesting entity (i.e., processor core 502A) via the response path shown in FIG. 7 of the drawings. In this example, the response path is exactly opposite to the request path. However, this may be altered to fit different system configurations.

It is important to note that all requests/responses are handled at the natural speed of the device under test, irrespective of the frequency that they are operating at. In other words, the processor cores and the link controllers may operate at different frequencies. Further, the responses do not involve the ATE path except when providing the test code and a system clock to the device under test.

In the examples described thus far, the request and response traverses all link layers, i.e., the protocol layer and the link layer, and the physical layer. However, the response agent 518 does not require such a traversal. It is possible, according to different embodiments, to isolate link errors. For example, if SBFT passes when request and responses are short circuited within the crossbar switch 518 (in other words, only the protocol layer is involved and the link and physical layers are not involved) and fails when the request and response are short circuited at the link controller level, one may infer that errors occur at the link layer. This is because short circuiting at the crossbar switch 518 shows that the protocol layer is working correctly, whereas short circuiting at the link controller level does not involve the physical layer. Thus, the only layer left is the link layer and therefore this must be the source of the error.

It will be appreciated by one skilled in the art that various implementations of the response agent 518 are possible. However, in a general sense, the response agent 518 requires a capture mechanism, a notification mechanism and a processing mechanism. In one embodiment, the capture mechanism may include a buffer to store incoming and outgoing data (memory mapped or dedicated). According to different embodiments, the notification mechanism may include a direct signal/wire, a processor interrupt, or a polling mechanism where the processor 502B polls the response agent 518, to determine if a test request/link packet has been received. In one embodiment, the response agent 518 includes special logic to handle the incoming requests. Alternatively, the processor 502B may be used in conjunction with the notification mechanism to process the request.

In one embodiment, the response agent 518 may be implemented as a specialized functional block. In other words, it has dedicated logic to store incoming flits in a capture buffer which is part of special logic that is notified of incoming flits, e.g., by a signal or a physical wire. The special logic processes the incoming flits and produces a response. The special logic, thereafter, writes a response back, which is then packaged as a link response which is then sent back to the processor core 502A.

In another implementation, the response agent 518 may be implemented by a processor-like element. In this embodiment, an incoming flit is captured and stored in a capture buffer. The capture buffer immediately notifies the processor via an interrupt that the incoming flit has been stored. Alternatively, the processor runs a program that polls a status bit of the capture buffer to determine if incoming flits have been captured. The processor reads the incoming flit from the capture buffer and generates a response. Thereafter, the processor writes a response, which is then packaged into a link response and sent back to the request processor core.

For the purposes of this specification, a machine-readable medium includes any mechanism that provides (i.e. stores and/or transmits) information in a form readable by a machine (e.g. computer) for example, a machine-readable medium includes read-only memory (ROM); random access memory (RAM); magnetic disk storage media; optical storage media; flash memory devices; electrical, optical, acoustical or other form of propagated signals (e.g. carrier waves, infra red signals, digital signals, etc.); etc.

It will be apparent from this description the aspects of the present invention may be embodied, at least partly, in software. In other embodiments, hardware circuitry may be used in combination with software instructions to implement the present invention. Thus, the embodiments of the invention are not limited to any specific combination of hardware circuitry and software.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method of testing a device comprising:
loading a local memory resource, for a processor core of the device, of non-uniform memory access design with a functional test program, the processor core being able to access non-local memory resources through a link control mechanism;
providing an external path for test signals generated by the processor core during execution of the functional test program, wherein the external path loops the test signals from the link control mechanism back to the link control mechanism.

2. The method of claim 1, wherein the link control mechanism comprises first and second link controllers and the external path bridges the test signals between the first and second link controllers.

3. The method of claim 2, further comprising providing a response agent that responds to the test signal.

4. The method of claim 1, wherein the external path is provided by an automatic test equipment.

5. The method of claim 4, wherein the loading is performed using the automatic test equipment.

6. The method of claim 1, wherein the local memory resource comprises cache memory.

7. The method of claim 6, further comprising enabling the processor core to operate in a test mode wherein the processor core executes a boot program directly from the cache memory.

* * * * *